(12) United States Patent
Cheon

(10) Patent No.: US 7,167,366 B2
(45) Date of Patent: Jan. 23, 2007

(54) SOFT COOLING JACKET FOR ELECTRONIC DEVICE

(75) Inventor: Kioan Cheon, 1414 S. 324 St., B-112, Federal Way, WA (US) 98003

(73) Assignee: Kioan Cheon, Auburn, WA (US)

( * ) Notice: Subject to any disclaimer, the term of this patent is extended or adjusted under 35 U.S.C. 154(b) by 219 days.

(21) Appl. No.: 10/761,503

(22) Filed: Jan. 20, 2004

(65) Prior Publication Data

US 2004/0190255 A1    Sep. 30, 2004

Related U.S. Application Data

(63) Continuation-in-part of application No. 10/241,118, filed on Sep. 11, 2002, now abandoned.

(51) Int. Cl.
*H05K 7/20* (2006.01)
*F28F 7/00* (2006.01)

(52) U.S. Cl. .................. 361/699; 165/46; 165/80.4

(58) Field of Classification Search ............... 361/688, 361/689, 698, 699, 700–703; 165/46, 80.4
See application file for complete search history.

(56) References Cited

U.S. PATENT DOCUMENTS

| | | | | |
|---|---|---|---|---|
| 3,542,032 A | * | 11/1970 | Spencer, Jr. ................. 607/114 |
| 4,493,010 A | * | 1/1985 | Morrison et al. ........... 361/698 |
| 4,733,720 A | * | 3/1988 | Havranek et al. .......... 165/80.4 |
| 4,805,767 A | * | 2/1989 | Newman ..................... 206/219 |
| 4,997,032 A | * | 3/1991 | Danielson et al. ............ 165/46 |
| 5,205,348 A | * | 4/1993 | Tousignant et al. ........... 165/46 |
| 5,245,508 A | * | 9/1993 | Mizzi ........................ 361/694 |
| 5,323,294 A | * | 6/1994 | Layton et al. ............... 361/699 |
| 5,329,419 A | * | 7/1994 | Umezawa .................... 361/699 |
| 5,560,423 A | * | 10/1996 | Larson et al. ........... 165/104.26 |
| 5,740,018 A | * | 4/1998 | Rumbut, Jr. ................. 361/720 |
| 6,301,097 B1 | * | 10/2001 | Ellsworth et al. ........... 361/679 |
| 6,622,782 B1 | * | 9/2003 | Malhammar .................. 165/46 |

FOREIGN PATENT DOCUMENTS

| | | | |
|---|---|---|---|
| AU | 639775 | * | 11/1991 |
| JP | 03-030399 | * | 2/1991 |

* cited by examiner

*Primary Examiner*—Michael Datskovsky
*Assistant Examiner*—Robert J. Hoffberg
(74) *Attorney, Agent, or Firm*—Delbert J. Barnard

(57) ABSTRACT

Provided is a water cooling type cooling jacket for an electronic device including a pouch body formed of a soft, loose elastic material that is deformable to closely contact heat-generating elements having various shapes due to a contact pressure and accommodating and a coolant, and a coolant inlet tube and a coolant outlet tube formed at one side of the pouch body to allow the coolant to circulate inside the pouch body and connected to coolant circulation lines for circulating the coolant. Therefore, the water cooling type jacket for an electronic device can be adapted to various shapes of heat-generating elements having uneven surfaces and various shapes of installation spaces beyond electrical and mechanical limitation to increase a heat transfer area and maximize a heat transfer efficiency and can be installed at various electronic devices such as hard disk drives, video cards or memory cards and a PCB without spatial limitation. Also, the water cooling type, soft cooling jacket for an electronic device can reduce a fabrication cost by simplifying the structure while maintaining close adhesion and can safely protect various elements by distributing pressure applied to the elements.

1 Claim, 13 Drawing Sheets

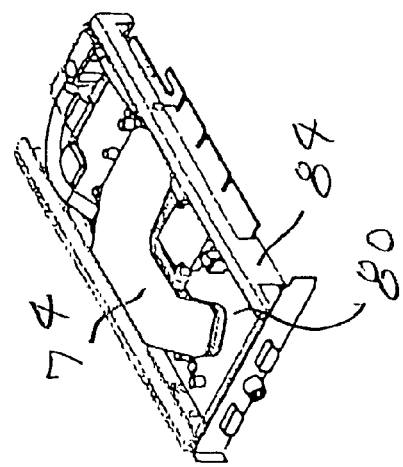
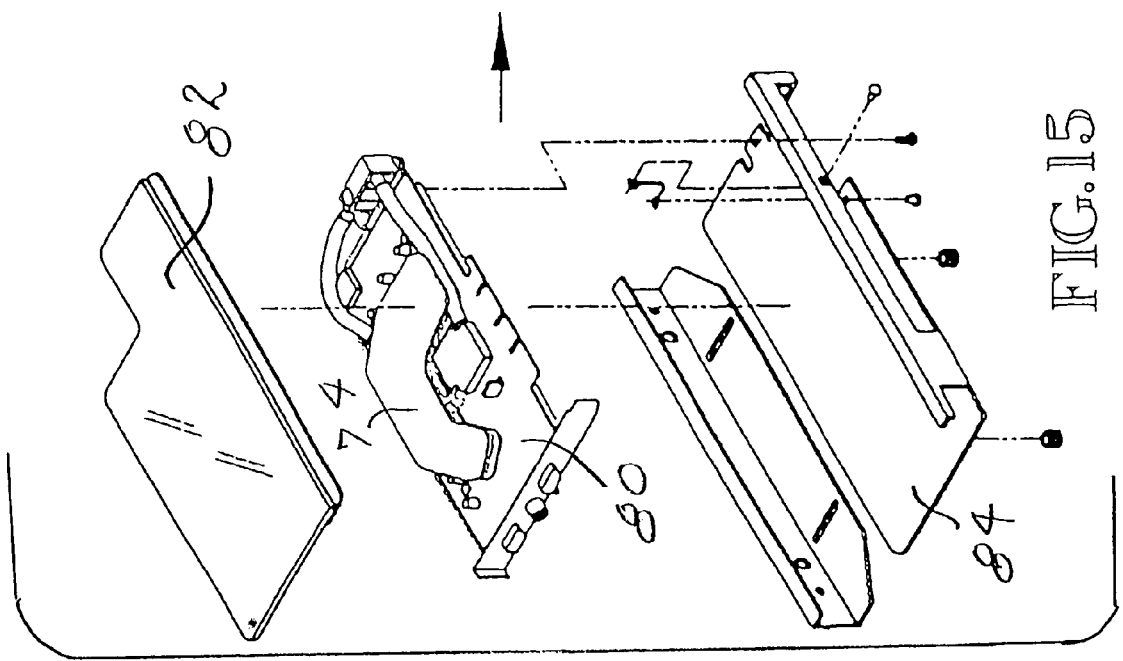
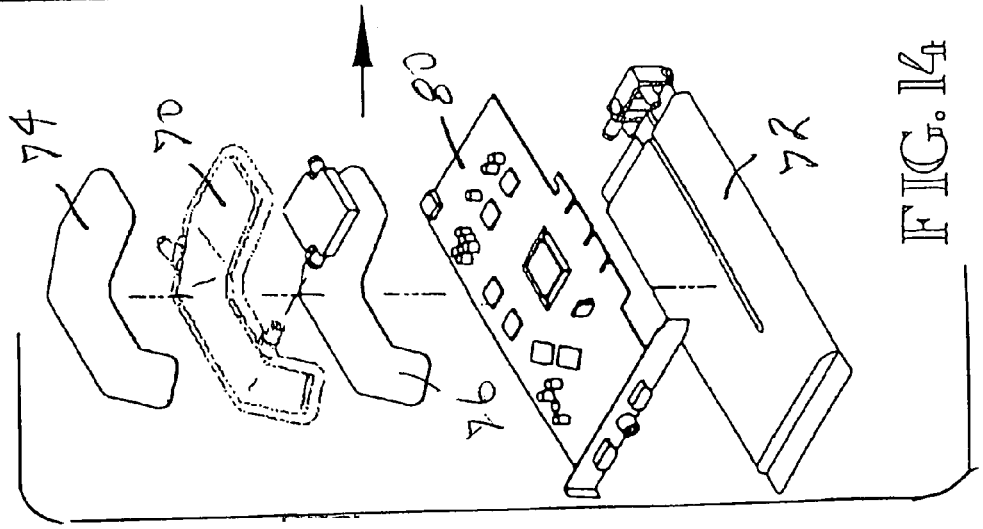

SOFT COOLING JACKET FOR ELECTRONIC DEVICE

RELATED APPLICATION

This is a continuation-in-part of Ser. No. 10/241,118, filed Sep. 11, 2002, now abandoned and entitled Water Cooling Type Soft Cooling Jacket for Electronic Device and Buffer Jacket Using the Same.

BACKGROUND OF THE INVENTION

1. Field of the Invention

The present invention relates to a water cooling type cooling jacket for an electronic device, and a buffer jacket using the same, and more particularly, to a water cooling type cooling jacket for an electronic device adaptively contacting on surfaces of heat-generating elements to increase close adhesion and a buffer jacket using the same.

2. Description of the Related Art

In general, in order to cool various heat-generating elements such as semiconductor chips or electronic devices in a water cooling manner, a surface contacting a heat-generating element has been made of metal and cooling blocks in which a coolant circulates have been used. Since the conventional cooling blocks are formed of hard materials such as metal in consideration of heat conductivity, it is difficult to make them contact various types of surfaces, e.g., uneven surfaces. Also, due to limitation in installation space, the cooling blocks are difficult to directly install on the various electronic devices such as hard disk drives, video cards or memory cards and a PCB. In order to increasing close adhesion, various adhesive devices having an elaborately fabricated contact surface and a strong clipping force have been used. However, such adhesive devices are mechanically complex.

In the case of conventional air cooling type cooling devices in which surfaces of complex heat-generating elements are brought into direct contact with air to be cooled, a capability of absorbing heat from the surfaces, that is, heat absorptivity, is low, resulting in a poor air cooling efficiency

SUMMARY OF THE INVENTION

To solve the above problems, it is an object of the present invention to provide a water cooling type, soft cooling jacket for an electronic device, which is adapted to various shapes of heat-generating elements having uneven surfaces and various shapes of installation spaces beyond electrical and mechanical limitation to increase a heat transfer area and maximize a heat transfer efficiency and which can be installed at various electronic devices such as hard disk drives, video cards or memory cards and a PCB without spatial limitation.

It is another object of the present invention to provide a water cooling type, soft cooling jacket for an electronic device which can reduce a fabrication cost by simplifying the structure while maintaining close adhesion and can safely protect various elements by distributing pressure applied to the elements.

It is still another object of the present invention to provide a water cooling type, soft cooling jacket for an electronic device which can smoothly circulate a coolant at a state in which it is bent, which can be simply dissembled and assembled, which can maintain close adhesion at a constant level, which can cool both an interior side and an exterior side of a substrate, and which can maximize a heat transfer efficiency by providing a separate casing filled with oil to allow heat generated from heat-generating elements to be absorbed into the oil to then secondarily remove heat from the heated oil.

It is further object of the present invention to provide a buffer jacket using the water cooling type, soft cooling jacket for an electronic device which can buffer pneumatic pressure due to a change in volume of interior oil depending on temperature in the case of cooling the electronic device in an air cooling manner by filling the buffer jacket with cooling oil.

In an embodiment of the present invention, there is provided a water cooling type water cooling jacket for an election device including a pouch body formed of a soft, loose elastic material that is deformable to closely contact heat-generating elements having various shapes due to a contact pressure and accommodating and a coolant, and a coolant inlet tube and a coolant outlet tube formed at one side of the pouch body to allow the coolant to circulate inside the pouch body and connected to coolant circulation lines for circulating the coolant.

The pouch body is preferably formed by interposing the filler between two transparent vinyl sheets, putting peripheries of the sheets together and hermetically sealing the same.

Also, the filler is preferably a porous filler sponge which is soft and lose for smooth circulation of a coolant and has a predetermined elasticity in order to establish a circulation space for a coolant and to obtain versatile contact elasticity.

The water cooling type cooling jacket may further include an adhering means for pressing the heat-generating element for fixing the pouch body to the heat-generating element.

According to another aspect of the present invention, the water cooling type cooling jacket may further include a casing surrounding the heat-generating element and the pouch body and filled with cooling oil contacting the surface of the pouch body to serve as a secondary coolant, a pressure exhauster including a pressure exhaust pipe installed on the internal ceiling of the casing and a pressure exhaust valve connected to the pressure exhaust pipe and exhausting high-pressure air or air bubbles to the outside, an oil supply cap installed on the casing to refill the oil, and an input/output connector sealed on the external surface of the casing to as to allow electrical connection between the heat-generating element and a controller for a computer.

In another embodiment of the present invention, there is provided a buffer jacket using a water cooling type cooling jacket for an electronic device including a pouch body formed of a soft, loose elastic material that is deformable to closely contact heat-generating elements having various shapes due to a contact pressure and accommodating and a coolant, an air pipe formed at one side of the pouch body so as to allow inflow or outflow of air according to the internal pressure of the pouch body, a casing accommodating the heat-generating element using internal cooling oil and the pouch body hermetically sealed or having the air pipe exposed outside, filled with the cooling oil contacting the heat-generating element to serve as a secondary coolant, and formed of a metal case that is hermetically sealed for dissipating heat outside, an oil supply cap installed on the casing for refiling or replacing the internal cooling oil of the casing, and an input/output connector installed in the casing to electrically connect the heat-generating element with the controller for a computer.

BRIEF DESCRIPTION OF THE DRAWINGS

The above object and advantages of the present invention will become more apparent by describing in detail preferred embodiments thereof with reference to the attached drawings in which:

FIG. 14 is a reduced scale view like FIG. 13;

FIG. 15 is a pictorial view showing the components of FIGS. 13 and 14 assembled and positioned between upper and lower frame members;

FIG. 16 is an assembled view of the component shown by FIG. 15;

DETAILED DESCRIPTION OF THE INVENTION

A water cooling type, soft cooling jacket for an electronic device according to preferred embodiments of the present invention and a buffer jacket using the same will now be described in more detail with reference to the accompanying drawings.

Figure 1:
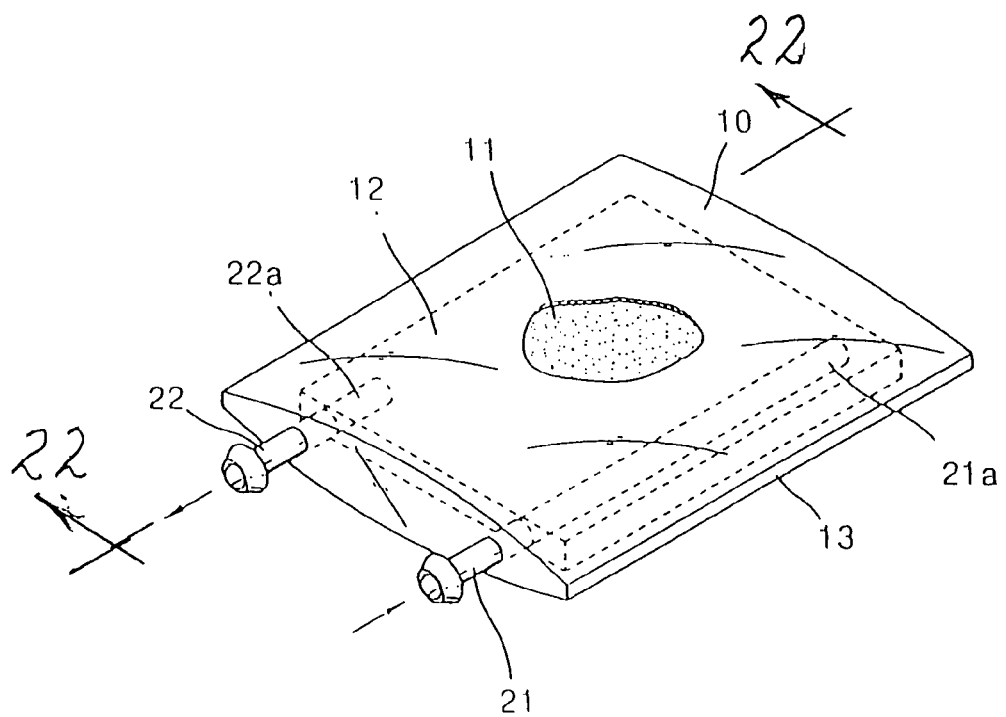
FIG. 1 a pictorial view of a water cooling type, soft cooling jacket for an electronic device according to an embodiment of the present invention.

First, as shown in FIG. 1 a water cooling type, soft cooling jacket according to an embodiment of the present invention is largely comprised of a pouch body 10, a coolant inlet tube 21 and a coolant outlet tube 22. The pouch body 10 is formed of a soft, loose elastic material that is deformable to closely contact heat-generating elements having various shapes due to a contact pressure and is capable of smoothly circulating a coolant, and accommodates a filler 11 and a coolant 12 to be hermetically sealed. The coolant inlet tube 21 and the coolant outlet tube 22 are formed at one side of the pouch body 10 to allow the coolant 12 to circulate inside the pouch body 10 and are connected to coolant circulation lines (not shown) for circulating the coolant 12.

Figure 4:
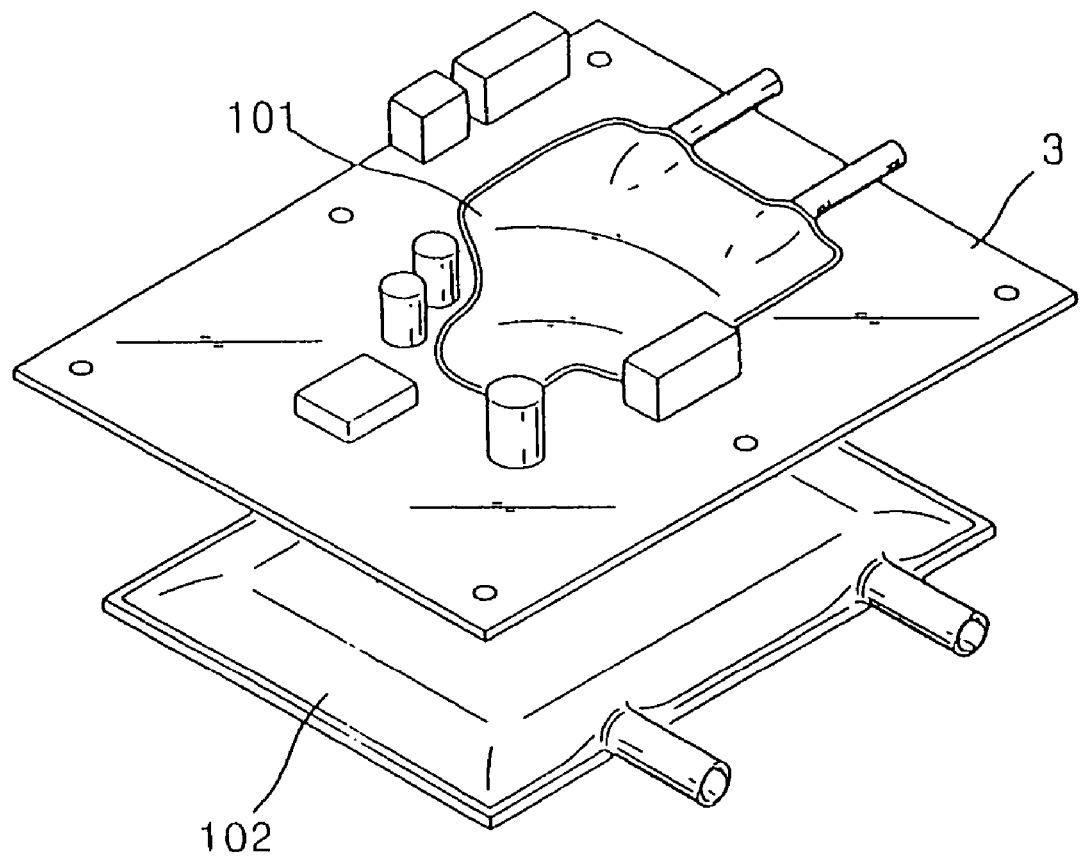
FIG. 4 is a pictorial view illustrating the use state of a water cooling type, soft cooling jacket according to another embodiment of the present invention.

The pouch body 10 is formed by interposing the filler 11 between two transparent vinyl sheets, putting peripheries 13 of the sheets together and hermetically sealing the same. As shown in FIG. 4, the external shape and size of the pouch body 10 are determined by shapes and installation locations of the heat-generating elements.

The pouch body 10 may have partitions so as to form a passageway therein. In order to establish a circulation space for a coolant and to obtain versatile contact elasticity, as shown in FIG. 1, as the filler 11, a porous filler sponge having a predetermined elasticity or other substitutes can be provided inside the pouch body 10.

In such a manner, the pouch body 10 has a space enough to allow the coolant 12 flow even if an external force is applied to the ouch body 10, thereby promoting sooth flow of the coolant 12. See FIG. 22.

Referring back to FIG. 1, for uniform flow of the coolant 12, the coolant inlet pipe 21 and the coolant outlet pipe 22 are preferably made to have different lengths so that an inlet outlet 21a of the coolant inlet pipe 21 and an internal inlet 22a of the coolant outlet pipe 22 are disposed at opposite diagonal edges so as to have the longest distance therebetween.

Also, the pouch body 10 has the peripheries 13 having strength and hardness enough to maintain the outline of the pouch body 10 so as to withstand impact or repeated load.

Figure 2:
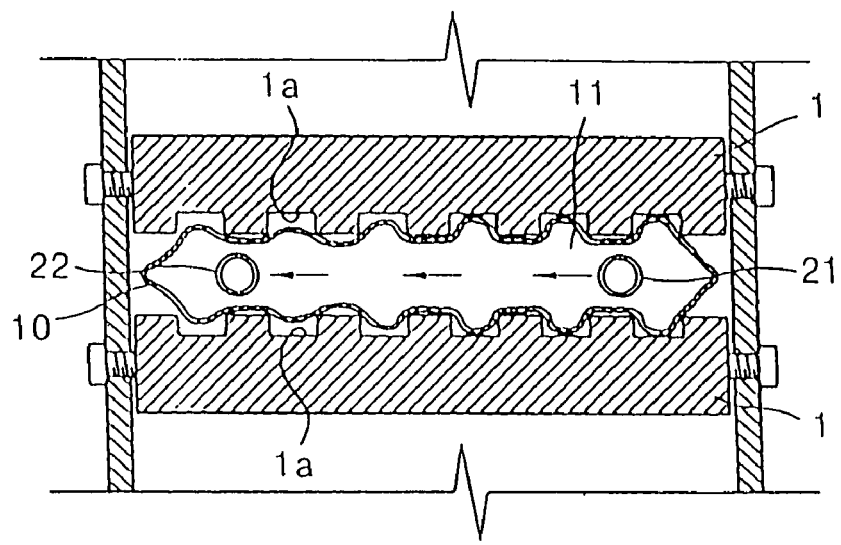
FIG. 2 is a conceptual diagram illustrating a state in which the water cooling type, soft cooling jacket for an electronic device shown in FIG. 1 is seated on a hard disk driver.
Figure 3:
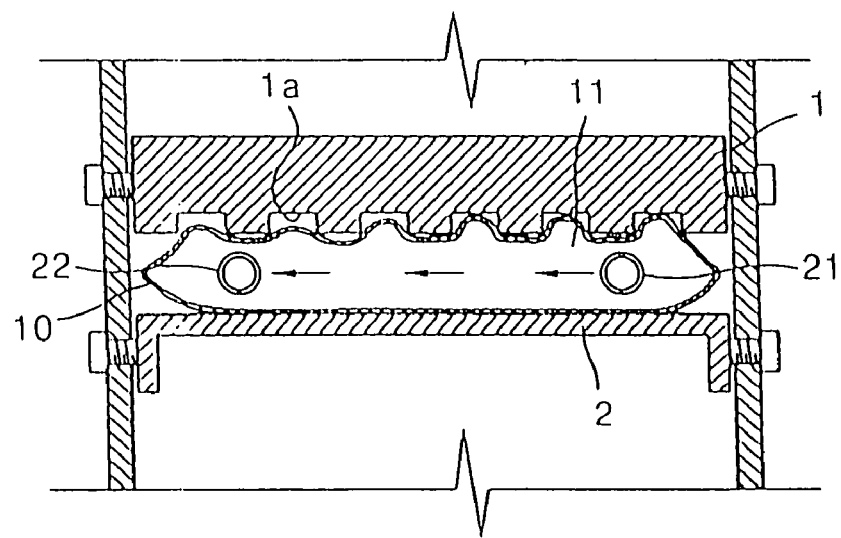
FIG. 3 shows another example of the water cooling type, soft cooling jacket shown in FIG. 2 applied to a hard disk driver.

Thus, as shown in FIG. 2, the pouch body 10 is disposed between two hard disk drives 1 having heat-generating planes 1a facing each other so that the heat-generating planes 1a contacts both upper and lower surfaces of the pouch body 10. Otherwise, as shown in FIG. 3, the pouch body 10 is supported on a fixing bracket 2 and contacts the heat-generating plane 1a of one hard disk drive 1. Then, the coolant 12 induced through he coolant inlet pipe 21 is exhausted to the coolant outlet pipe 22 while absorbing heat to then be exhausted.

Figure 5:
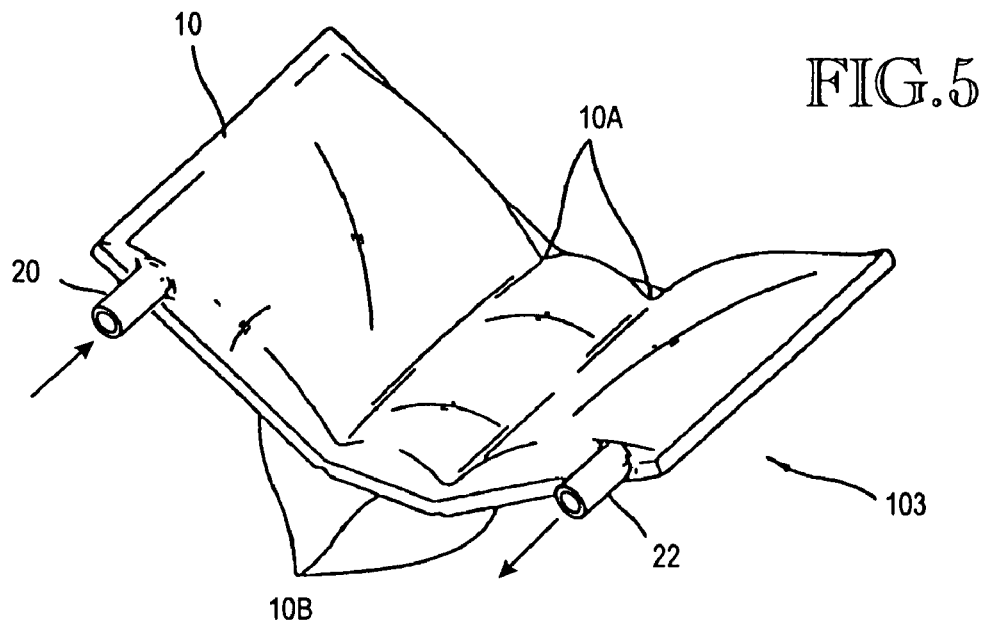
FIG. 5 is a pictorial view of a water cooling type, soft cooling jacket for an electronic device according to still another embodiment of the present invention.
Figure 6:
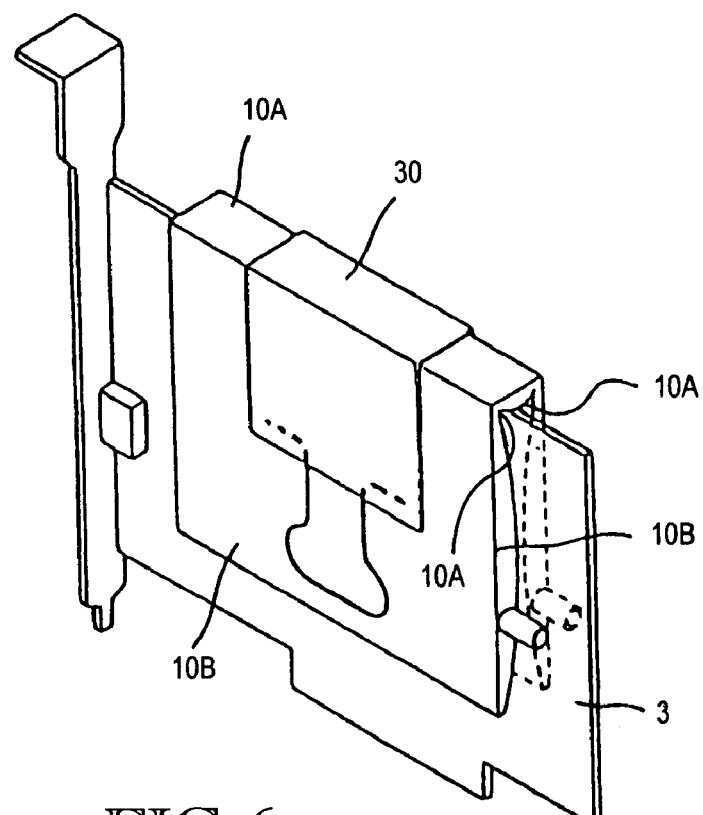
FIG. 6 is a pictorial view illustrating the use state in which the water cooling type, soft cooling jacket shown in FIG. 5 is applied to a board for a video card.

As shown in FIG. 4, the pouch body 10 can be applied to not only the hard disk drives 1 but also various computer elements or electronic heat generating elements and a board 3. If heat-generating planes are formed at upper and lower portions of the board 3 shown in FIG. 4, an upper pouch body 101 and a lower pouch body 102 may be separately provided. As shown in FIGS. 5 and 6, bent lines 10a are formed so as to bend the heat-generating elements according to shape, thereby providing a foldable pouch body 103.

The water cooling type, soft cooling jacket according to another embodiment of the present invention, as shown in FIGS. 5 and 6, may further include a clipping device 30 for clipping the pouch body 10 and the heat-generating element 3 together using an elastic spring as adhering means for covering one surface of the pouch body 10 not contacting the heat-generating element 3 and for pressing the heat-generating element in order to fix the pouch body 10 with a hard collapse-resistant plate 10b having strength and hardness enough to maintain close contact between the heat-generating element 3 and the pouch body 10.

Thus, as shown in FIG. 6, the water cooling type, soft cooling jacket according to another embodiment of the present invention is bent so as to cover both front and back surfaces of a heat-generating element such as a semiconductor chip on the board 3 such as a video card for a computer, the collapse-resistant plate 10b maintains the bent shape in a state in which a coolant keeps flowing through bent portions and the clipping device 30 makes the collapse-resistant plate 10b closely adhere to the board 3. In such a manner, the coolant circulates through the coolant inlet pipe 21 and the coolant outlet pipe 22 and the circulating coolant absorbs heat from front and back surfaces of the heat-generating element.

The adhering means may be configured in various forms other than the clipping device. Preferably, as shown in FIGS. 10 and 11, when the adhering means is applied to the detachable disk drive 4, it may be configured to allow close adhesion to be selectively performed by user's option such that it rotates about a push rod 31 contacting the pouch body 10 elevatably moving and a rotation shaft 32 and includes a switching lever 33 fixed to a cam 34 slidably contacting the push rod 31 so as to selectively elevate the push rod 31.

Figure 10:
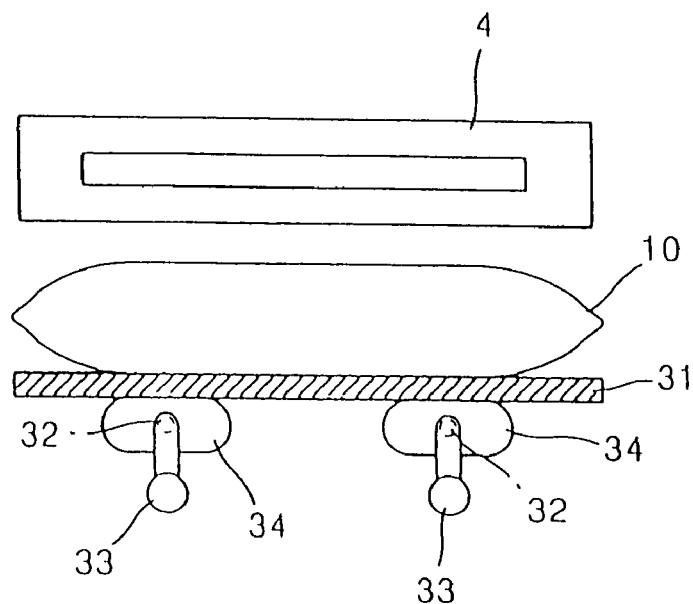
FIGS. 10 and 11 are conceptual diagrams sequentially illustrating the state in which the water cooling type, soft cooling jacket for an electronic device according to the present invention is applied to a detachable hard disk driver to be selectively in close contact therewith.
Figure 11:
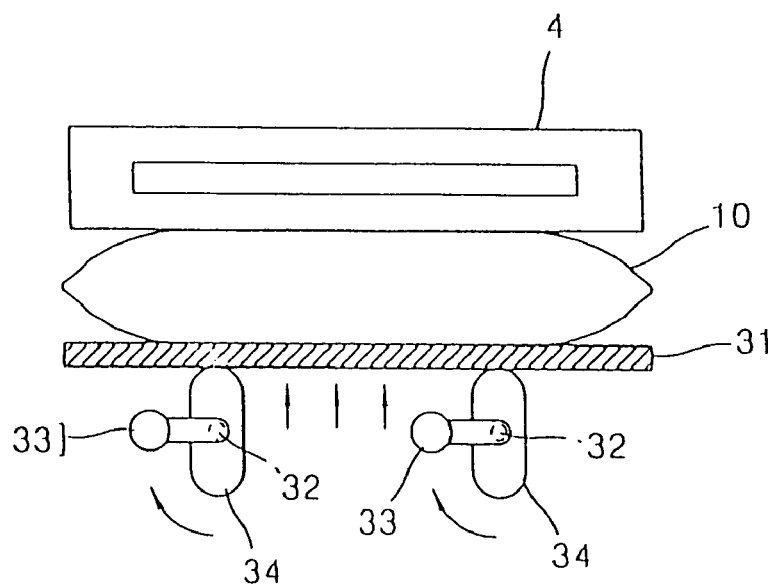

Thus, after the detachable hard disk drive 4 is inserted into a hard disk drive case as shown in FIG. 10, the switching lever 33 is rotated about the rotation shaft 32 to make the cam 34 to stand so that the push rod 31 selectively presses the pouch body 10, thereby making the pouch body 10 closely contact the hard disk drive 4. Then, in order to extract the detachable hard disk drive 4, the switching lever 33 is reversely rotated to make the cam 34 lie so that the push rod 31 is lowered to make the detachable hard disk drive 4 free. In such a manner, the detachable hard disk drive 4 can be extracted.

Figure 7:
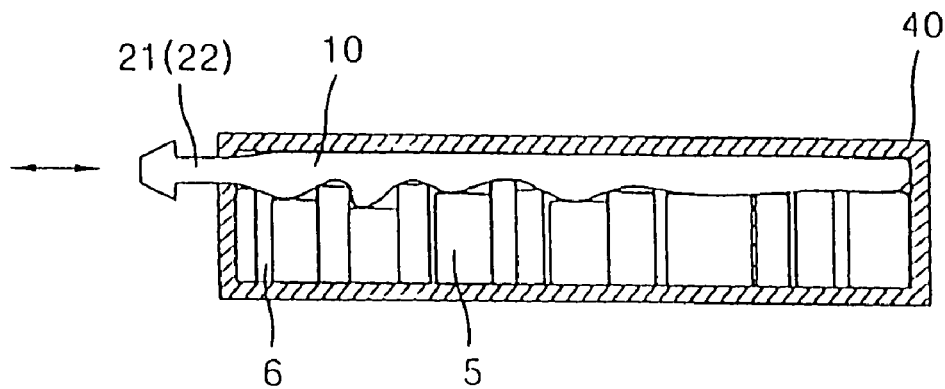
FIG. 7 is a side view of a water cooling type, soft cooling jacket for an electronic device according to a further embodiment of the present invention.

As shown in FIG. 7, a water cooling type, soft cooling jacket according to still another embodiment of the present invention may further include a complicated heat-generating element 5 and a casing 40 surrounding the heat-generating element 5 and the pouch body 10 and filled with cooling oil 6 contacting the surface of the pouch body 10 to serve as a secondary coolant.

A printed circuit board (PCB) having a complicated surface such as a computer power supply is incorporated into the casing 40 and the pouch body 10 and the oils 6 are inserted thereinto to then be hermetically sealed, thereby allowing the oil to primarily absorb heat from the heat-generating element 5 and the coolant in the pouch body 10 to secondarily absorb the heat from the oil 6 to then be exhausted outside.

Figure 8:
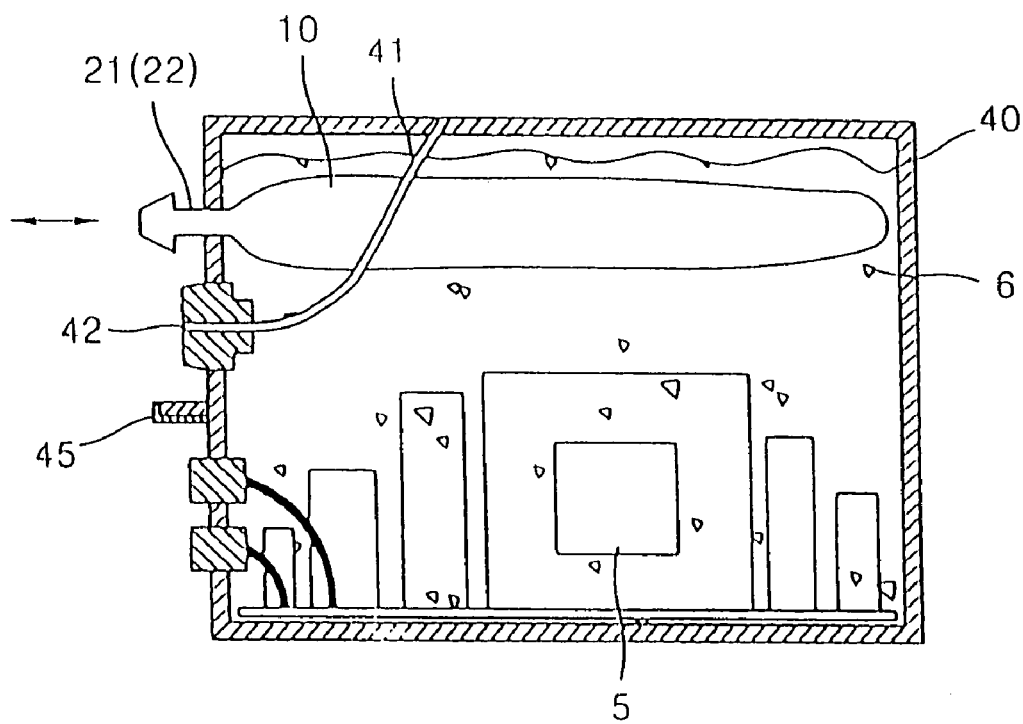
FIG. 8 is a side view of a water cooling type, soft cooling jacket for an electronic device according to still further embodiment of the present invention.
Figure 9:
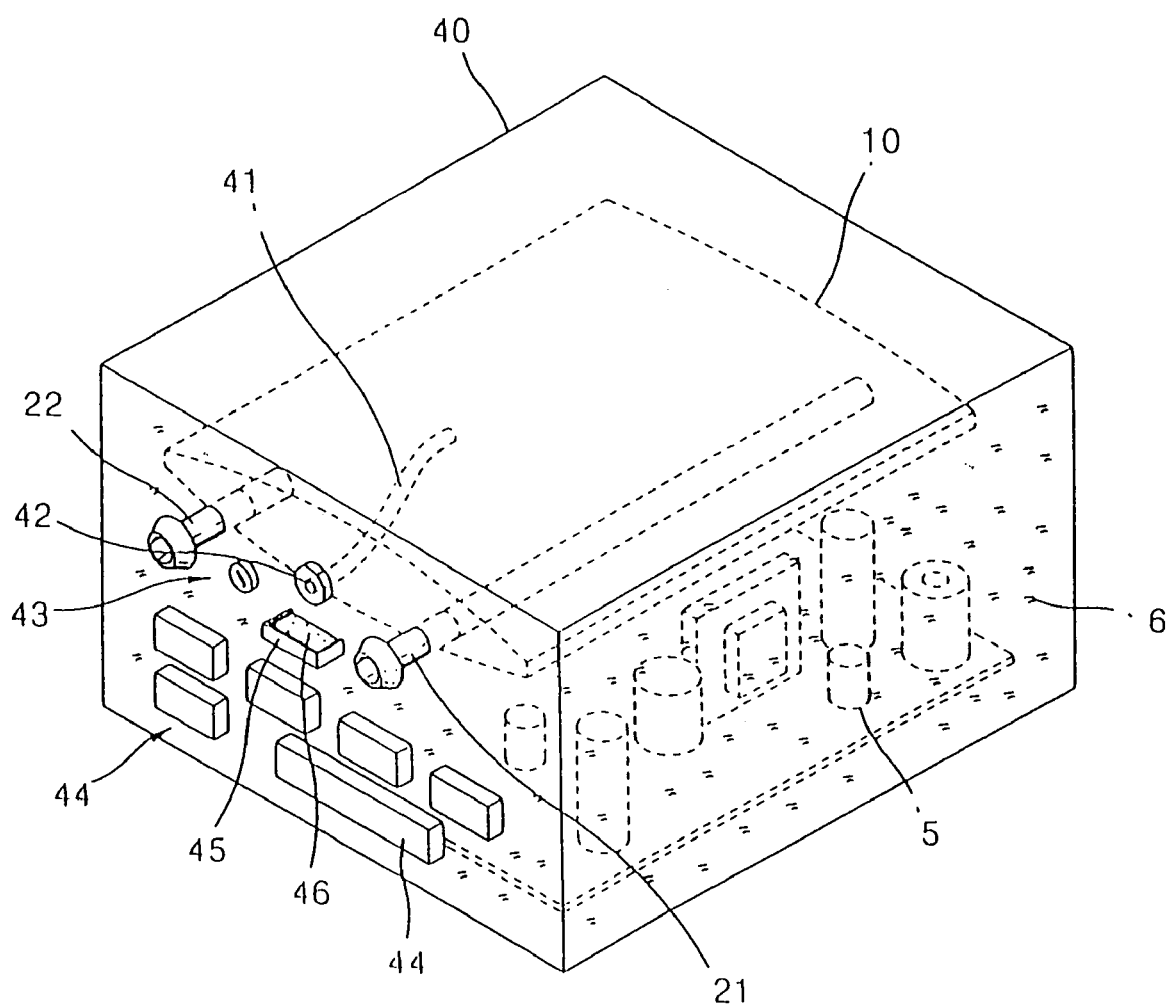
FIG. 9 is a perspective view of the water cooling type, soft cooling jacket for an electronic device shown in FIG. 8.

As shown in FIGS. 8 and 9, a water cooling type, soft cooling jacket according to still another embodiment of the present invention may further include a pressure exhauster including a pressure exhaust pipe 41 installed on the internal ceiling of the casing 40 and a pressure exhaust valve 42 connected to the pressure exhaust pipe 41 and exhausting high-pressure air or air bubbles to the outside, in addition to the pouch body 10 and the casing 40.

As shown in FIG. 9, a water cooling type, soft cooling jacket according to still another embodiment of the present invention may further include an oil supply cap 43 installed on the casing 40 to refill the oil 6 and an input/output connector 44 sealed on the external surface of the casing 40 so as to allow electrical connection between the heat-generating element 5 and a controller for a computer (not shown).

The casing 40 may further include a saucer 45 for holding oil that may leak downward the pressure exhaust valve 42, and a sponge 46 installed on the saucer 45 to absorb and dry the oil.

Since various heat-generating PCBs are wrapped with the casing 40 and the pouch body 10 and oil are incorporated into the casing 40 to then be perfectly sealed, making the structure into a unit block, heat can be absorbed uniformly from complicated surface of a PCB or heat-generating element, thereby exhausting the absorbed heat to the outside.

Figure 12:
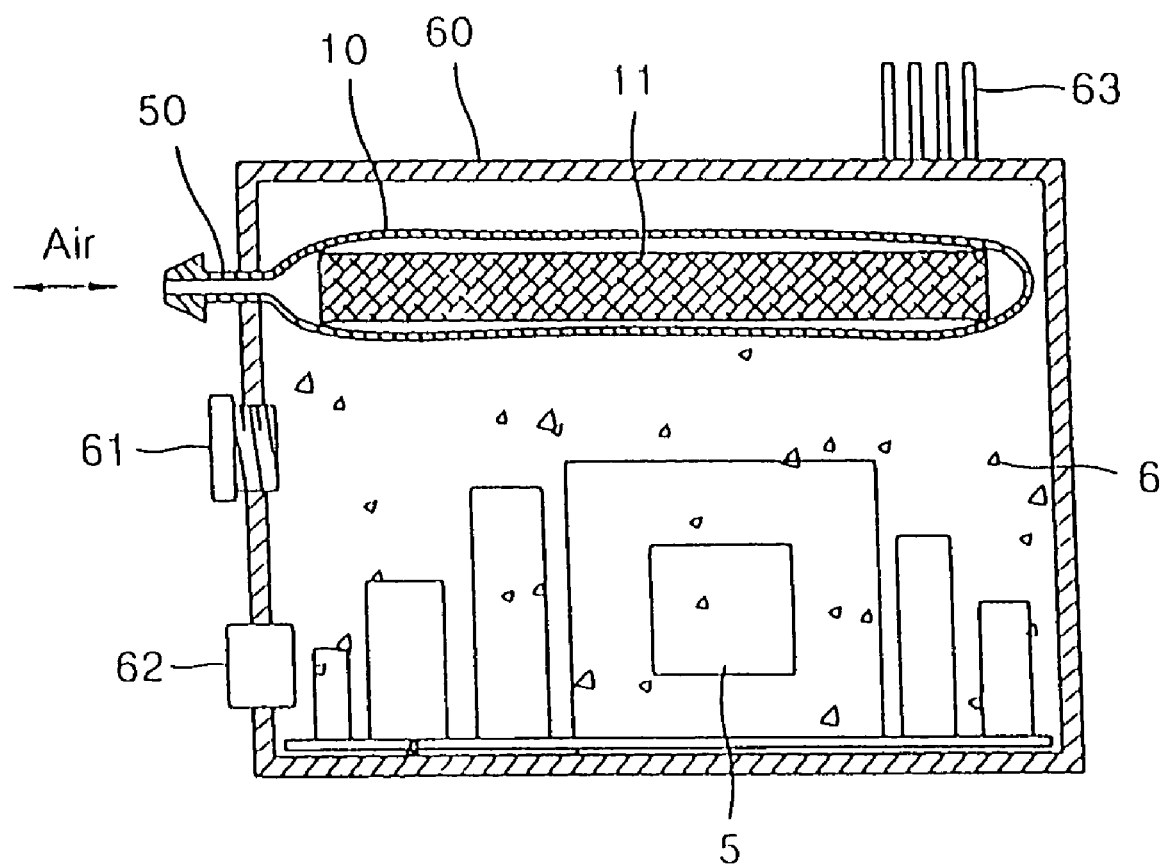
FIG. 12 is a cross-sectional view of a buffer jacket using the water cooling type cooling jacket according to the present invention.

As shown in FIG. 12, a buffer jacket using the water cooling type, soft cooling jacket according to the present invention is configured such that the internal coolant is removed from the cooling jacket to allow air circulation and is incorporated into a casing filled with oil such that an air pipe is exposed outside, thereby being equipped with a pouch body 10, an air pipe 50, a casing 60, an oil supply cap 61 and an electrical input/output connector 62.

The pouch body 10 includes air and a filler 11, e.g., sponge, which maintains a predetermined interior space, and is made of a soft, elastic material that is deformable due to an external pressure. The pouch body 10 is the same as that of the above-described cooling jacket except that a coolant is removed therefrom.

The air pipe 50 is formed at one side of the pouch body 10 so as to allow inflow or outflow of air according to the internal pressure of the pouch body 10. The air pipe 50 is the same as the coolant inlet pipe or coolant outlet pipe in view of configuration. However, since coolant circulation is not necessary, a single air pipe is provided.

The casing 60 accommodates a heat-generating element 5 such as an electronic circuit to dissipate heat generated from the heat-generating element 5 using internal cooling oil 6 and the pouch body 10 hermetically sealed or having the air pipe 50 exposed outside, and is filled with the cooling oil 6 contacting the heat-generating element 5 to serve as a secondary coolant. Also, the casing 60 is a metal case that is hermetically sealed for dissipating heat outside.

The casing 60 is formed of a material having high heat conductivity so as to easily dissipate heat outside and may have various-shaped irregularities 63 on its surface.

The oil supply cap 61 is installed on the casing 60 for refilling or replacing the internal cooling oil 6 of the casing 60.

The electrical input/output connector 62 is installed in the casing 60 to electrically connected the heat-generating element 5 with the controller for an electronic device such as a computer.

Figure 13:
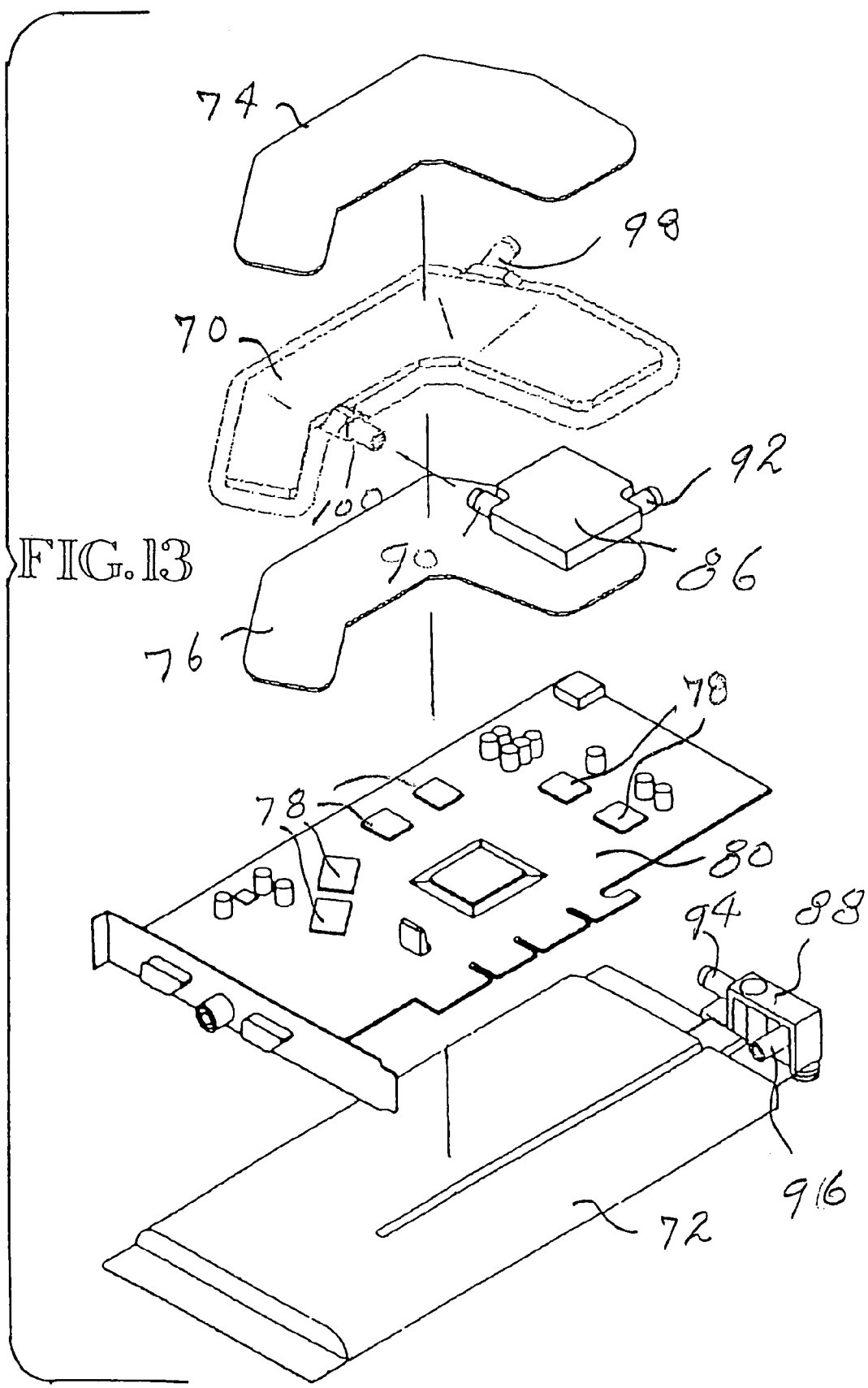
FIG. 13 is a an exploded pictorial view of an embodiment of the invention which includes an upper soft cooling jacket above a circuit board and a lower soft cooling jacket below the circuit board.
Figure 17:
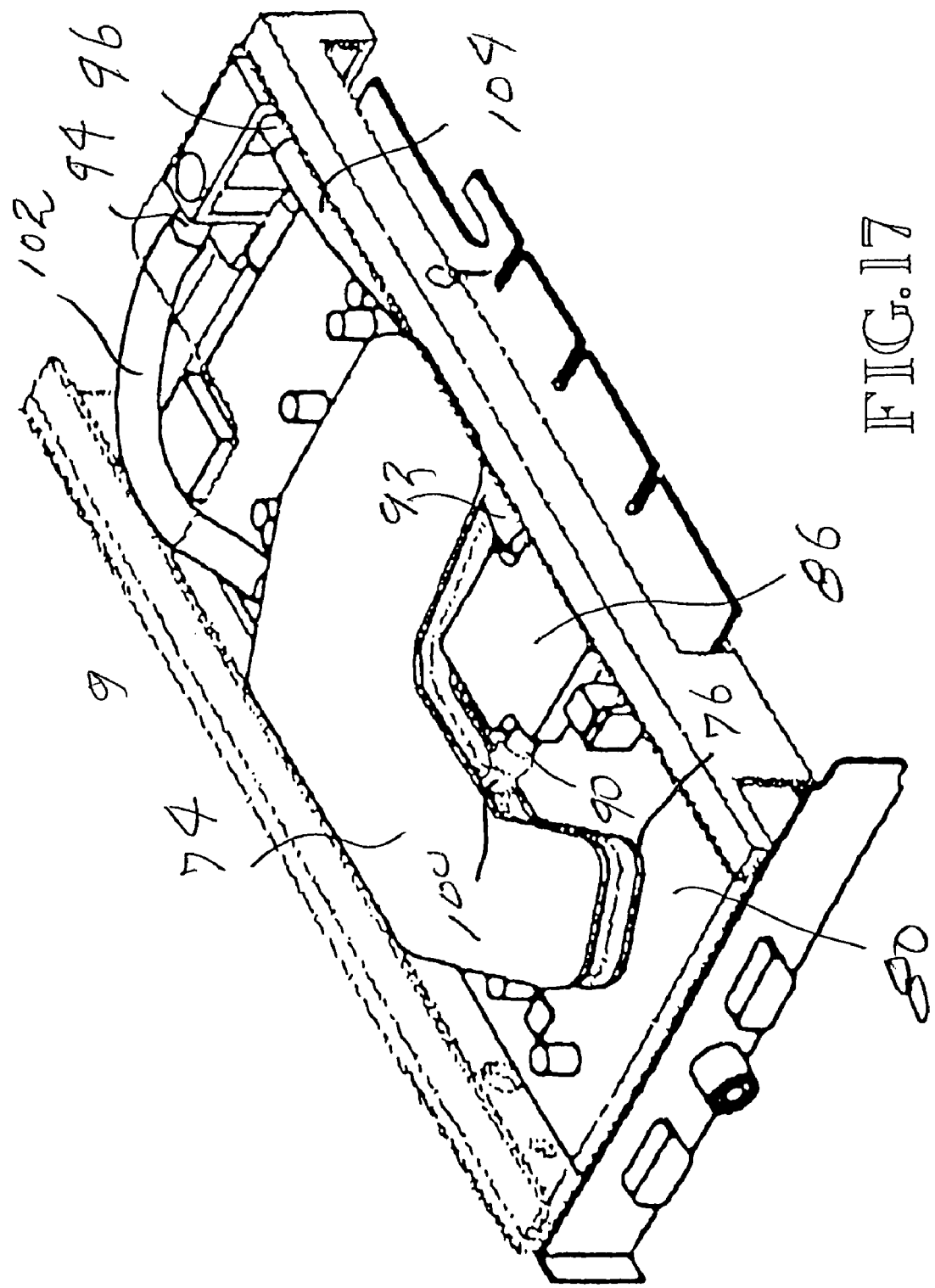
FIG. 17 is an enlarged scale view of FIG. 16.

FIG. 13 shows an upper soft cooling jacket 70 and a lower soft cooling jacket 72. Jacket 70 is sandwiched between upper and lower heat spreaders 74, 76. Heat spreaders 74,76 are cut from thin sheets of aluminum or other metal. Helmets 78 are pieces of two sided tape that are used to secure the heat spreader 76 to an electronic component board 80 for a video card application. FIG. 15 shows the components of FIG. 14 assembled and positioned between a housing wall 82 and a housing wall 84. FIG. 16 shows the components of FIG. 15 in an assembled state. FIG. 17 is an enlarged scale view of FIG. 16.

The embodiments of FIGS. 13–17 may include fittings 86, 88. Fitting 86 includes a first nipple 90 and a second nipple 92. Nipple 90 is connected into nipple 92 internally of the fitting 86. Fitting 88 includes a first nipple 94 and a second nipple 96. Nipple 94 is connected to nipple 96 internally of the fitting 88.

Soft coolant jacket 70 includes a nipple 98 and a nipple 100. In FIG. 17, a hose 102 is shown connecting nipple 94 to nipple 98. Nipple 90 is shown connected to nipple 100. A second hose 104 is shown connecting nipple 92 to nipple 96. This connection of nipples and hoses provides a coolant path through the components. This coolant path may continue through coolant jacket 72 or coolant jacket 72 may have an independent flow passageway built into it. See for example, FIG. 1. Heat in components 82, 80, 84 is spread into the heat spreaders 74, 76 and is sufficiently cooled by the coolant that is being circulated in the coolant jackets 70, 72.

Figures 18, 19:
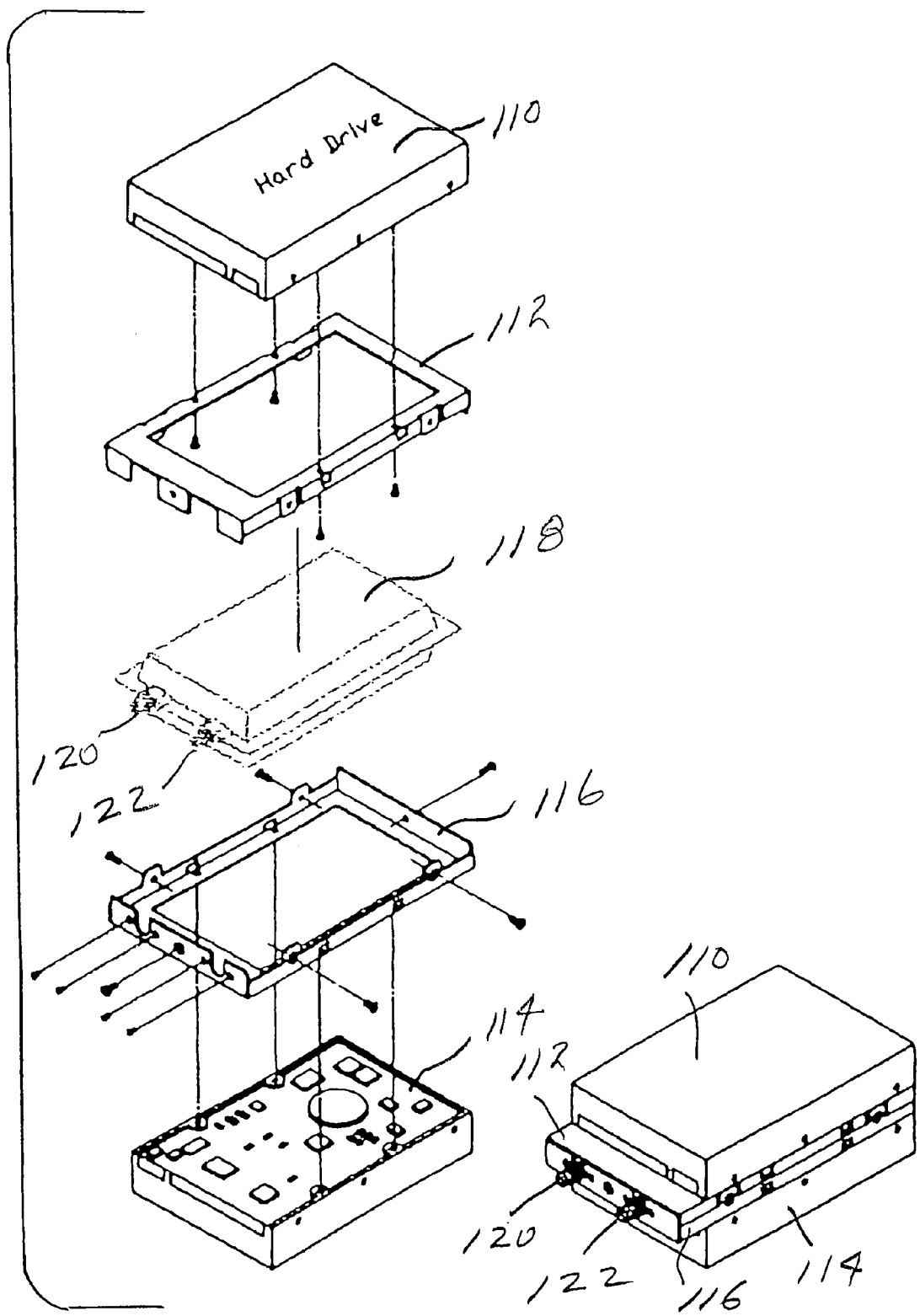
FIG. 18 is an exploded pictorial view of another embodiment of the invention, showing a soft cooling jacket positioned between upper and lower hard drive frames and hard drives.
FIG. 19 an assembled view of the components shown by FIG. 18.
Figure 21:
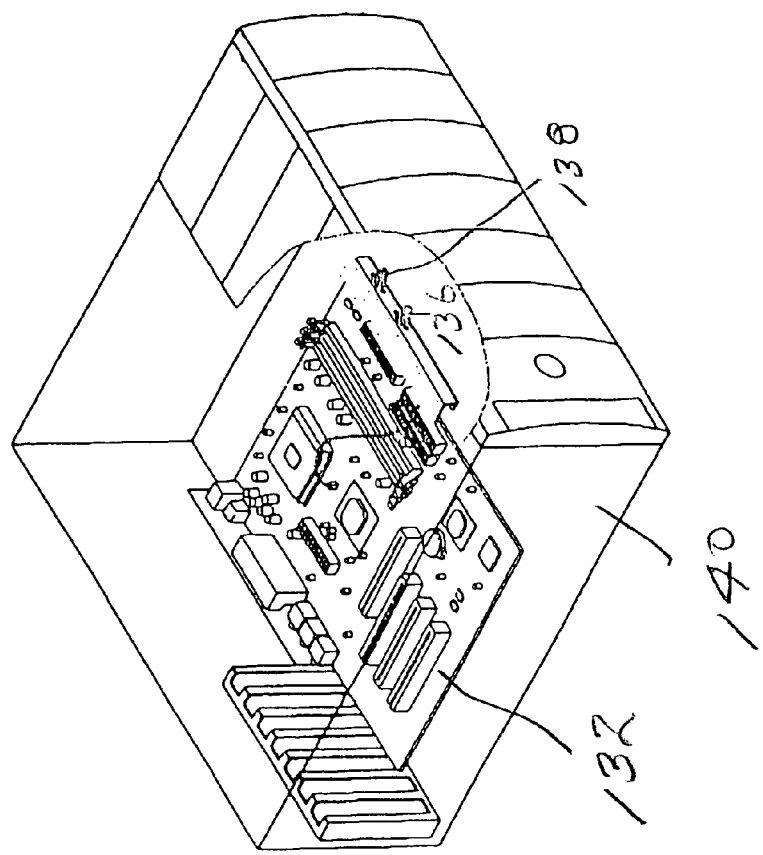
FIG. 21 is a fragmentary pictorial view of a computer cabinet, showing the components of FIG. 20 assembled and positioned within the cabinet.

In the embodiment shown by FIG. 18, a first hard drive 110 is shown connected to a first hard drive frame 112. A second hard drive 114 is shown connected to a second hard drive frame 116. A soft cooling jacket 118 is shown positioned between the frames 112, 116. Cooling jacket 118 includes fittings 120, 122. Coolant enters one of the fittings 120, 122 flows through the coolant jacket 118, and then leaves through the other fitting 120, 122. See FIG. 1 and the description relating to FIG. 1.

FIG. 19 shows the components of FIG. 18 assembled together. The embodiment of FIGS. 18 and 19 is similar to the embodiment of FIG. 2.

Figure 22:
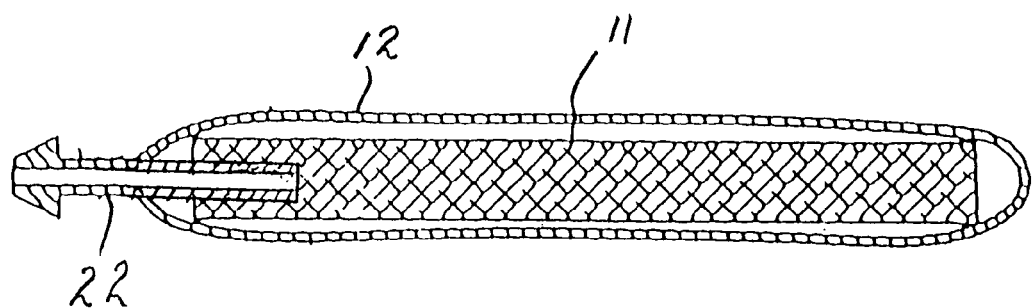
FIG. 22 is a longitudinal sectional view through the soft cooling jacket shown by FIG. 1, such view been taken substantially along line 22—22 of FIG. 1.
Figure 20:
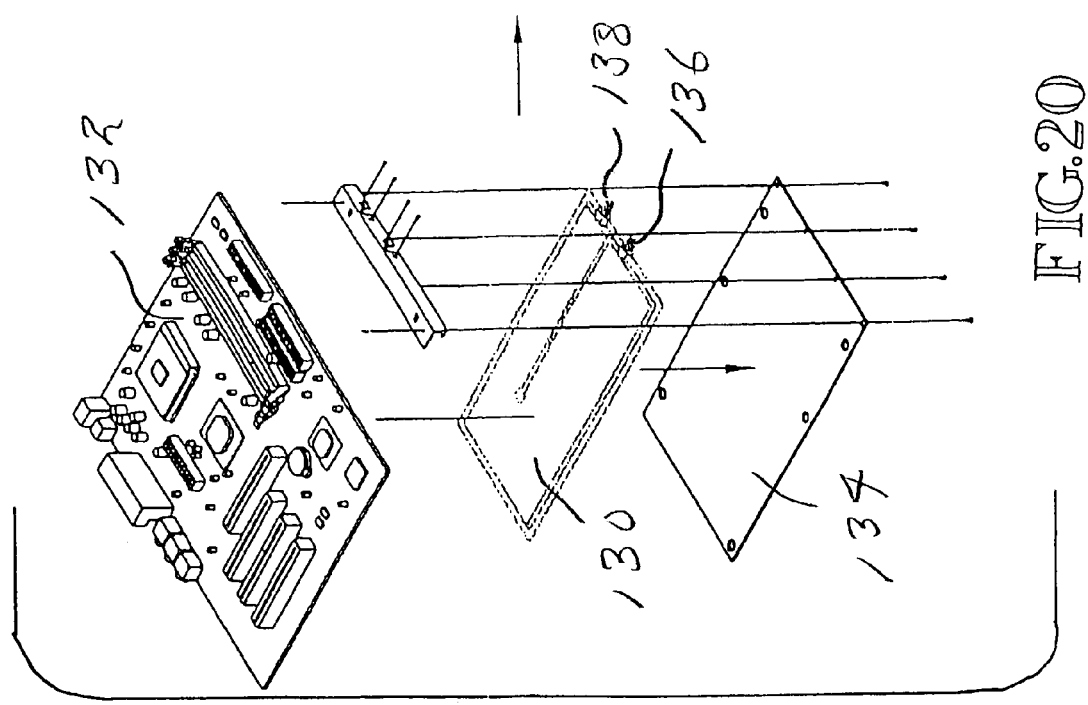
FIG. 20 is an exploded pictorial view of another embodiment, showing a soft cooling jacket positioned between a motherboard and a frame member.

In the embodiment shown by FIGS. 20 and 22, a soft cooling jacket 130 is shown positioned between a motherboard 132 and a metal back plate 134. Cooling jacket 130 includes fittings 136, 138. One of the fittings 136, 138 is an inlet fitting. The other is an outlet fitting. FIG. 22 shows the components of FIG. 20 assembled together and placed within a computer housing 140.

Therefore, the buffer jacket using the water cooling type, soft cooling jacket according to the present invention is configured to cool the heat-generating element 5 in an air cooling manner rather than a water cooling manner. The pouch body 10 serves to absorb the internal pressure generated during high-temperature expansion of the oil 6 and to cool the oil 6 and the heat-generating element 5 in a an air cooling manner such that external cold air is induced into the pouch body 10 through the air pipe 50.

Although specific embodiments have been illustrated and described, it will be obvious to those skilled in the art that various modifications may be made without departing from what is intended to be limited solely by the appended claims. For example, it has been described in the above-described embodiments of the present invention that the invention is applied to computer parts or electronics PCBs.

Therefore, it is to be understood that the invention is not to be limited to the disclosed embodiments but, on the contrary, is intended to cover various modifications and equivalent arrangements included within the spirit and scope of the appended claims.

As described above, according to the present invention, a water cooling type cooling jacket for an electronic device can be adapted to various shapes of heat-generating elements having uneven surfaces and various shapes of installation spaces beyond electrical and mechanical limitation to increase a heat transfer area and maximize a heat transfer efficiency and can be installed at various electronic devices such as hard disk drives, video cards or memory cards and a PCB without spatial limitation.

Also, the water cooling type, soft cooling jacket for an electronic device according to the present invention can reduce a fabrication cost by simplifying the structure while maintaining close adhesion and can safely protect various elements by distributing pressure applied to the elements.

Further, according to the present invention, the water cooling type, soft cooling jacket for an electronic device can smoothly circulate a coolant at a state in which it is bent, can be simply dissembled and assembled, can maintain close adhesion at a constant level, can cool both an interior side and an exterior side of a substrate, and can maximize heat transfer efficiency by providing a separate casing filled with oil to allow heat generated from heat-generating elements to be absorbed into the oil to then secondarily remove heat from the heated oil.

What is claimed is:

1. A coolant jacket for cooling heat generating electrical elements on a support member, said coolant jacket comprising:
   a pouch comprising flexible sidewalls that meet and are connected together at a periphery, said pouch having an inner space;
   a resilient body of porous material in the inner space;
   a coolant inlet leading into the pouch and into the body of porous material;
   a coolant outlet leading from the body of porous material and outwardly from the pouch; and
   said body of porous material being compressible an amount sufficient to allow it and a sidewall of the pouch to at least partially conform to the shape of the heat generating electrical elements on the support member while maintaining circulation space in the pouch for coolant so that coolant can enter the pouch, flow through the porous body, and then flow out from the coolant outlet,
   wherein the pouch comprises a first edge and a second edge spaced from the first edge, wherein the resilient body of porous material has a first edge adjacent the first edge of the pouch and a second edge positioned against the second edge of the pouch, wherein the coolant inlet leads into the pouch through the first edge and the coolant outlet leads out from the pouch through the first edge, and wherein one of said coolant inlet and said coolant outlet terminates in the resilient body of porous material adjacent the first edge of the resilient body of porous material and the other of said coolant inlet and coolant outlet terminating closely adjacent the second edge of the resilient body of porous material.

* * * * *